(12) United States Patent
Dudnikov, Jr. et al.

(10) Patent No.: US 8,222,537 B2
(45) Date of Patent: Jul. 17, 2012

(54) SIMULTANEOUS AND SELECTIVE PARTITIONING OF VIA STRUCTURES USING PLATING RESIST

(75) Inventors: George Dudnikov, Jr., San Jose, CA (US); Franz Gisin, San Jose, CA (US)

(73) Assignee: Sanmina-Sci Corporation, San Jose, CA (US)

( * ) Notice: Subject to any disclaimer, the term of this patent is extended or adjusted under 35 U.S.C. 154(b) by 371 days.

(21) Appl. No.: 12/483,223

(22) Filed: Jun. 11, 2009

(65) Prior Publication Data

US 2009/0288874 A1    Nov. 26, 2009

Related U.S. Application Data

(63) Continuation of application No. 11/369,448, filed on Mar. 6, 2006, now abandoned.

(60) Provisional application No. 60/658,886, filed on Mar. 4, 2005.

(51) Int. Cl.
*H05K 1/11* (2006.01)
(52) U.S. Cl. ......... 174/262; 174/256; 174/261; 361/761
(58) Field of Classification Search ............... 174/254, 174/262–266, 255–260; 361/792–795
See application file for complete search history.

(56) References Cited

U.S. PATENT DOCUMENTS

| | | | | |
|---|---|---|---|---|
| 6,891,272 | B1* | 5/2005 | Fjelstad et al. | 257/774 |
| 2002/0100608 | A1* | 8/2002 | Fushie et al. | 174/255 |
| 2003/0121699 | A1* | 7/2003 | Happoya | 174/262 |

\* cited by examiner

*Primary Examiner* — Jeremy Norris
(74) *Attorney, Agent, or Firm* — Julio M. Loza; Loza & Loza, LLP

(57) ABSTRACT

Systems and methods for simultaneously partitioning a plurality of via structures into electrically isolated portions by using plating resist within a PCB stackup are disclosed. Such via structures are made by selectively depositing plating resist in one or more locations in a sub-composite structure. A plurality of sub-composite structures with plating resist deposited in varying locations are laminated to form a PCB stackup of a desired PCB design. Through-holes are drilled through the PCB stackup through conductive layers, dielectric layers and through the plating resist. Thus, the PCB panel has multiple through-holes that can then be plated simultaneously by placing the PCB panel into a seed bath, followed by immersion in an electroless copper bath. Such partitioned vias increase wiring density and limit stub formation in via structures. Such partitioned vias allow a plurality of electrical signals to traverse each electrically isolated portion without interference from each other.

21 Claims, 6 Drawing Sheets

SIMULTANEOUS AND SELECTIVE PARTITIONING OF VIA STRUCTURES USING PLATING RESIST

CROSS-REFERENCE TO RELATED APPLICATIONS

This application claims the benefit of U.S. Ser. Nos. 11/369,448, filed Mar. 6, 2006 and 60/658,886, filed Mar. 4, 2005, incorporated herein by reference in its entirety.

FIELD OF THE INVENTION

The present invention relates to printed circuit boards (PCBs), and more particularly, to systems and methods for simultaneously partitioning a via structure into electrically isolated portions by using plating resist within a PCB stackup for allowing a plurality of electrical signals to traverse each electrically isolated portion without interference from each other.

BACKGROUND

Consumers are increasingly demanding both faster and smaller electronic products. The use of PCBs has grown enormously as new electronic applications are marketed. A PCB is formed by laminating a plurality of conducting layers with one or more nonconducting layers. As the size of a PCB shrinks, the relative complexity of its electrical interconnections grows.

A plated via structure is traditionally used to allow signals to travel between layers of a PCB. The plated via structure is a plated hole within the PCB that acts as a medium for the transmission of an electrical signal. For example, an electrical signal may travel through a trace on one layer of the PCB, through the plated via structure's conductive material, and then into a second trace on a different layer of the PCB.

Unfortunately, due to limitations within the prior art, the plated via structure may be longer than necessary to perform the function of electrical connectivity. For example, the plated via structure may extend completely through the PCB but only connect two traces on two proximate adjacent layers. As a result, one or more stubs may be formed. A stub is excessive conductive material within the plated via structure which is not necessary to transport the electrical signal.

When a high speed signal is transmitted through the plated via structure, a "stub effect" may distort the signal. The stub effect is a result of the useless excess conductive material present within the plated via structure. The stub effect occurs when a portion of the signal is diverted away from the trace connections and into one or more stubs of the plated via structure. The portion of the signal may be reflected from the end of the stub back toward the trace connections after some delay. This delayed reflection may interfere with signal integrity and increase, for example, the bit error rate of the signal. The degenerating effect of the stub effect may increase with the length of the stub. As much as 50% of signal attenuation at signals running at 10 Gigabits per second may be due to the stub in the plated via structure. Via structures with short stubs can be manufactured but require sequential processing, which increases costs substantially.

FIG. 1 is an illustration of a PCB 100 with a plated via structure 110 and a stub 170 in the prior art. The PCB 100 consists of conducting layers 130 separated by nonconductive dielectric layers 120. Typically, the plated via structure 110 includes a barrel (i.e., shaft of the via structure) that is cylindrical in shape and is plated with a conductive material 180. The plated via structure 110 allows an electrical signal 160 to transmit from a trace 140 on a first conducting layer 130 of the PCB 100 to a trace 150 on a second conducting layer 130. The stub 170 of the plated via structure 110 is the unnecessary portion of the plated via structure 110, which may create the stub effect.

FIG. 2 is an illustration of the PCB 100 with the plated via structure 110 after the stub 170 (shown in FIG. 1) has been removed by backdrilling in the prior art. Backdrilling the unnecessary portion of the plated via structure 110 to reduce or remove the stub 170 is one method to reduce the stub effect. Backdrilling is a viable alternative to sequential layer processing but has limitations. Typically, a drill bit backdrills the stub 170 thereby removing a portion of the unnecessary excess conductive material of the plated via structure 110. A backdrilled hole 200 is created once the drill bit removes a portion of the stub 170 from the plated via structure 110. The drill bit is commonly a carbide drill bit in a computer numerically controlled (CNC) drill machine. As a result of backdrilling, the portion of the stub 170 of the plated via structure 110 is removed, thereby reducing, but not completely eliminating, parasitic capacitance, parasitic inductance, and time delay, which may interfere with signal integrity.

In most cases, design concessions need to be made to allow for deviations in the accuracy of the drilling equipment. If the backdrilling is inaccurate (e.g. too deep or off center), then a functional portion of the plated via structure 110 may be removed and the PCB 100 may be ruined. As a consequence, a new PCB 100 must be reconstructed and backdrilled. Thus, yields are reduced and costs are increased.

The backdrilling process is also limited in the tolerances that can be reliably held. Backdrilling is typically only controllable to a depth tolerance of +/−5 mils. In many cases, further design concessions need to be made due to limitations in the strength and consistency of the layers to allow for variations in the placement, width, and direction of drilling.

Yet another limitation is that many designs require the backdrilling of multiple plated via structures 110 where the stubs 170 may be at different depths. This requires specialized programming of the drill tool files, which takes time and money to produce.

Further, backdrilling multiple plated via structures 110 typically is a serial process, so that the time needed to backdrill the PCB 100 increases with the number of stubs 170. If any one of the stubs 170 is drilled improperly, the PCB 100 may be ruined. Therefore, backdrilling a number of stubs 170 increases the probability of damage to the PCB 100.

Another limitation is that many designs also require stubs to be removed from both surfaces of the PCB 100. This requires that the PCB 100 be reoriented during the backdrilling process, which further takes time, requires additional programming, and adds potential error to the accuracy of the backdrilling process.

Further, drill bits are prone to breakage which reduces yields and requires rework of the PCB 100. The process of reworking each individual plated via structure 110 adds cycle time and increases costs in production. Moreover, drill bits are expensive, which further drives up costs.

One consequence of backdrilling is that the volume of the removed stub barrel is not functional in the context of circuit routing. No other trace or interconnect on any layer can pass through the volume of the removed stub. Circuit traces need to be re-routed around such volumes. In most cases, additional layers need to be added to effectively route all the traces in a given design and thus add to complexity and cost.

PCBs can be split into two or more sections to reduce stub lengths or increase wiring density using methods known in the art such as sequential processing techniques. With sequential processing, two separate PCB subassemblies are individually manufactured. The two subassemblies are subsequently laminated together and through-holes or vias are plated to connect the two individual PCBs into one. Stubs can be controlled in this manner, but are limited to the layers between the two individual sub assemblies. Because of the "sequential nature" of such a lamination process, additional process steps are required and cost and cycle time to manufacture is significantly increased.

DETAILED DESCRIPTION OF THE INVENTION

A cost effective and efficient system to minimize signal degradation is to electrically isolate, reduce, or eliminate a stub by controlling the formation of a conductive material within a plated via structure of a printed circuit board (PCB). One or more areas of plating resists within the via structure are used to resist the formation of conductive material by intentionally creating one or more voids in the via structure. As a result, the formation of conductive material within the via structure may be limited to those areas necessary for the transmission of electrical signals. According to certain embodiments, the partitioning of the via structure into electrically isolated segments can dramatically increase the route capabilities or wiring density of a PCB design. This is because each electrically isolated segment of the partitioned via can be used to electrically connect signals on layers associated that particular segment.

A multilayer PCB can be a chip substrate, a motherboard, a backplane, a backpanel, a centerplane, a flex or rigid flex circuit. The invention is not restricted to use in PCBs. A via structure can be a plated through-hole used for transmitting electrical signals from one conducting layer to another. A plated via structure can also be a component mounting hole for electrically connecting an electrical component to other electrical components on the PCB.

The methods to electrically isolate, reduce, or eliminate a stub within via structures of PCBs may be faster and more efficient than backdrilling. Plating resists may be placed within the many clearances in the conducting and/or dielectric layers of the PCB simultaneously. In most cases PCBs can have through-holes and vias in the order of 100,000 plus. At the same time, the multi-layer PCB can have multiple layers. It would be advantageous to partition each of the vias and control the stub to variable degrees for each via. In other words, each via can be partitioned at different layers and at different locations. To be able to partition all the vias simultaneous on a single panel, plating resist can be selectively deposited on a selected layer of each sub-composite core during the making of the PCB stackup prior to drilling and subsequent plating of the vias in the panel. For example, all the clearances within a layer of a PCB may be formed concurrently. In another example, the conductive material may be formed within all of the via structures of a PCB at the same time. In contrast, as discussed previously, backdrilling is generally performed upon one via structure at a time. Thus, methods incorporating plating resists to limit stub formation may allow for faster production of PCBs than backdrilling.

Figure 1:
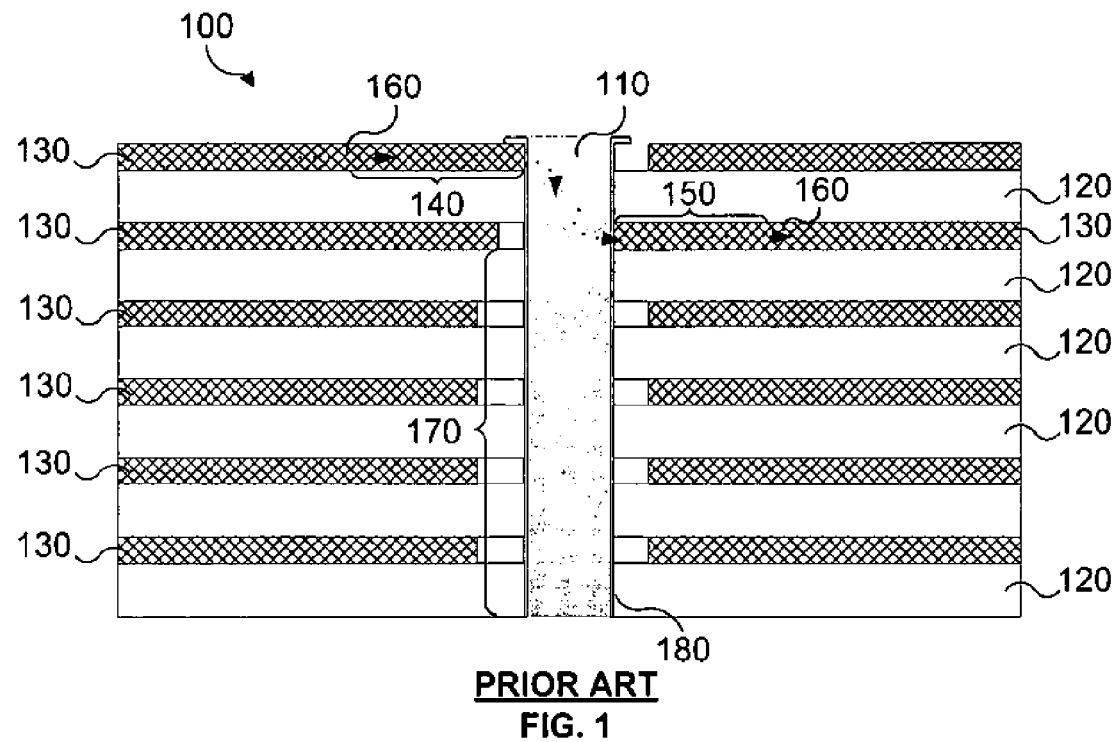
FIG. 1 is an illustration of a PCB with a plated via structure and a stub in the prior art.
Figure 2:
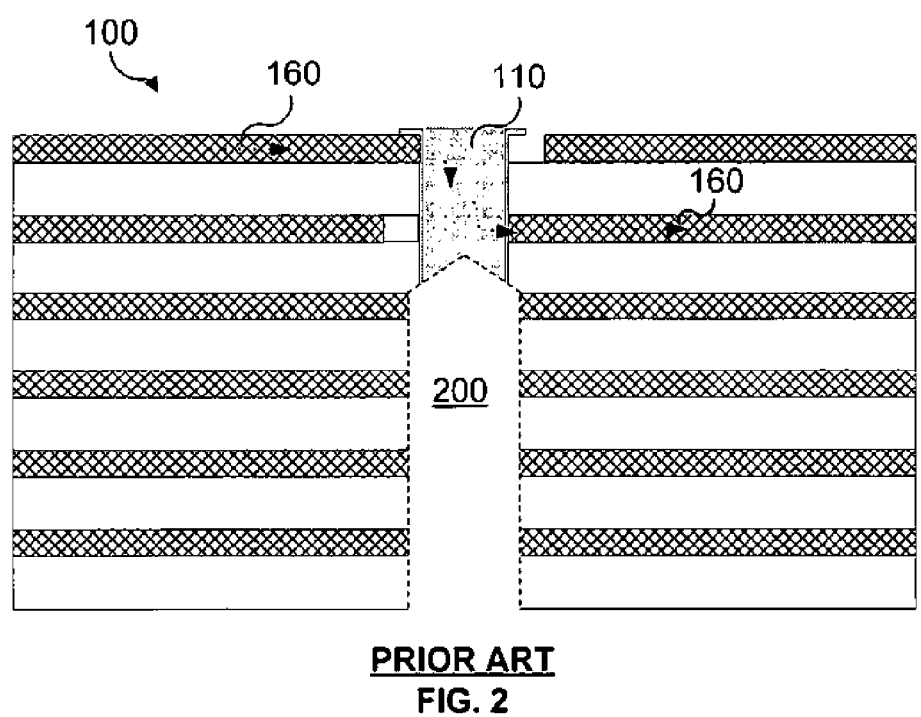
FIG. 2 is an illustration of the PCB with the plated via structure after the stub has been removed by backdrilling in the prior art.
Figure 3:
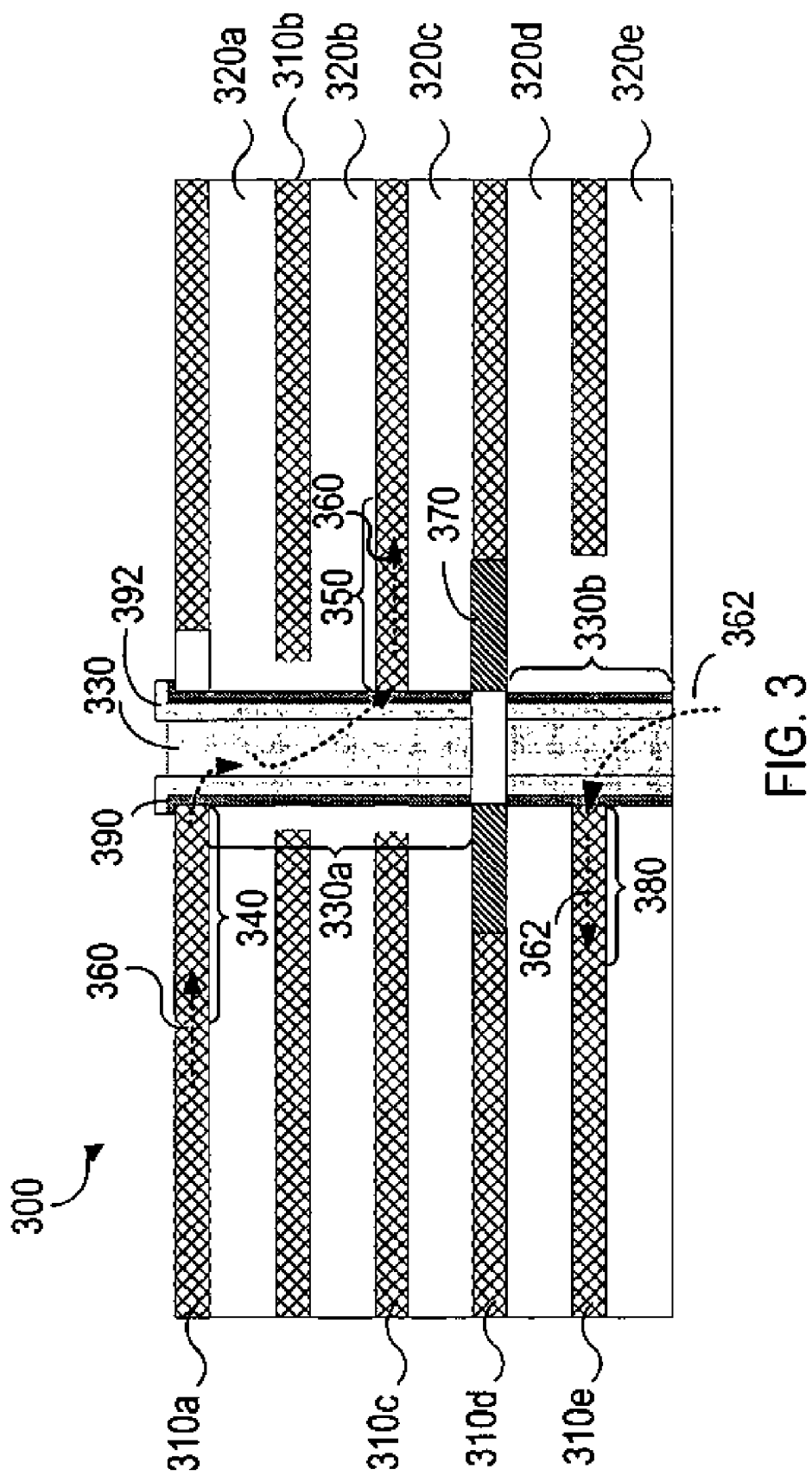
FIG. 3 is an illustration depicting a PCB with a plated via structure formed through a plating resist, according to certain embodiments.

FIG. 3 is an illustration depicting a PCB 300 with a plated via structure 330 formed through a plating resist 370, according to certain embodiments. The PCB 300 includes conducting layers 310a-310e separated by dielectric layers 320a-320e. The plated via structure 330 is plated with a seed conductive material 390 and a further coating of conductive material 392. The plated via 330 is effectively partitioned into a plurality of electrically isolated portions (330a, and 330b) by selectively depositing plating resist in a sub-composite structure for making the PCB stackup. A method of partitioning a plated via such as plated via 330 is described herein with reference to FIGS. 4 to 8.

FIG. 3 shows that the plated via allows an electrical signal 360 to transmit from one trace 340 or component mounting pad on a first conducting layer 310a to another trace 350 on a second conducting layer 310b of the PCB 300 by traversing the isolated portion 330a of the via 330. Similarly, the isolated portion 330b of the via 330 allows another electrical signal 362 to transmit to trace 380 without interfering with the signal 360.

Plating resist is a generally nonconductive material deposited in one or more clearances of conducting and dielectric layers. For example, in FIG. 3, plating resist is deposited in a clearance in the conducting layer 310d. When PCB 300 is placed in a seed or catalyzing bath, the seed will deposit on all areas of the via wall but will not deposit on the plating resist. Should small amounts of seed be deposited on the plating resist, a post processing operation can be utilized to remove these residual deposits. Subsequently, when the panel is placed into an electroless copper or electrolytic copper plating bath, copper will plate where there is seed or conductivity and will not plate or deposit in the area where there is plating resist. The plating resist will form a cylindrical void that effectively partitions the barrel of the via into segments.

The plating resist 370 prevents the deposition of the catalyzing material 390 and conductive material 392 within the via structure 330 at the conducting layer 310d. As a result, via 330 is partitioned into the electrically isolated portions 330a, and 330b. Consequently, the electric signal 360 travels from the first conducting layer 310a to the second conducting layer 310b without signal integrity being degraded through interference caused by section 330b. The conductive material 392 of the plated via structure 330 is the medium through which the electrical signal 360 travels from the first conducting layer 310a of the PCB 300 to the second conducting layer 310b. Similarly, electric signal 362 traverses plated via 330 conductive layer 310e. The plated via structure 330 may be of any shape.

Some examples of the conductive or catalytic material 390 are electroless copper, palladium seed. The catalytic seeding process can also include electrophoretic plating, or direct metallization. The plating process wherein the conductive material 392 such as conductive metal, or copper is deposited within the via structure 330 may comprise electrolytic plating, or an electroless process.

The PCB 300 can have any number of conducting layers and dielectric layers. FIG. 3 only shows five layers of conducting layers 310a-310e and five layers of dielectric layers 320a-320e for the sake of simplicity. Each of the conducting layers 310a-310e may comprise a partial or full layer such as a power or ground layer, may comprise a layer of circuit traces, or may comprise a layer with both circuit traces and a partial layer such as a ground layer. A non-limiting example of the conducting layers 310a-310e is copper. Some non-limiting examples of dielectric layers 320a-320e are FR-4, epoxy glass, polyimide glass, ceramic hydrocarbon, polyimide film, resin impregnated woven glass, film, resin impregnated matte material, Kevlar, paper, and resin dielectrics with dispersed nano-powders. According to certain embodiments, the partitioned via is filled with an insulating or resistive paste to improve reliability or functionality.

A method of partitioning a plated via such as plated via 330 is described herein with reference to FIGS. 4 to 8. As described further herein, a clearance is a hole that is within at least one conducting layer 310a-310e and/or at least one dielectric layer 320a-320e. For example, a clearance may be formed in the conducting layer 310e. Each clearance has a radius greater than the plated via structure 330. The formation of the clearances through an etching process is described below with reference to FIGS. 4-8.

FIGS. 4-8 are examples depicting etching a clearance within the conducting layer 310d, as well as the placement and deposition of the plating resist 370, according to certain embodiments of the invention. It is to be noted that the etching as described with reference to FIGS. 4-8 would apply to both conductive layers of the sub-composite structure. For purposes of simplicity, the etching is described with reference to one conductive layer (310d) of FIG. 4-8. Further, for simplicity, FIGS. 4-8 describes the selective deposition of plating resist on one location in a core sub-composite structure. However, it is understood that plating resist can be selectively deposited on multiple locations in the sub-composite structure depending on the PCB design. Moreover, each sub-composite structure may have the plating resist selectively deposited on different layers than that of other sub-composite structures so as to achieve the desired PCB design by laminating these various sub-composite structures to form the PCB stackup.

Figure 4:
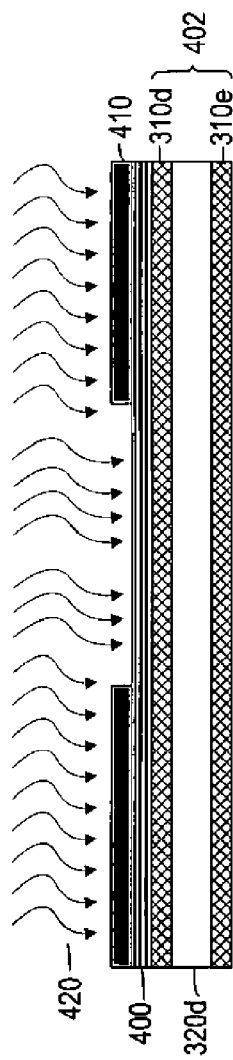
FIG. 4 is an illustration depicting a core sub-composite structure covered with a layer of etch resist that is selectively exposed to electromagnetic radiation, according to certain embodiments.

FIG. 4 is an illustration depicting a core sub-composite structure covered with a layer of etch resist that is selectively exposed to electromagnetic radiation, according to certain embodiments. FIG. 4 shows sub-composite structure 402 (also referred to herein as a core) that includes a dielectric layer 320d sandwiched between two conducting layers 310d, and 310e. Conductive layer 310d is covered with an etch resist 400. Portions of the etch resist is covered with a mask 410.

The etch resist 400 is any material that is applied to an area of the conducting layer 310d to prevent reaction of that area during an electromagnetic, chemical, or electrochemical etching process. The etch resist 400 may be processed by a lithographic process, by selective deposition, or by direct laser imaging. Some examples of etch resist 400 are photoresist, organic material, dry film, sheet, paste, polymer thick film, and liquid.

Mask 410 is a film or plate that selectively covers an area to prevent reaction of the covered area during the electromagnetic, chemical, or electrochemical reaction. Some examples of the mask 410 are silver film, glass, or diazo film. Mask 410 may be positioned over the etch resist 400 with a mask aligner (not depicted) which is configured to control the placement of the mask 410. The exposed portion of the etch resist 400 is exposed to electromagnetic radiation 420, or a laser, as non-limiting examples, and altered to make the exposed etch resist removable while leaving the covered etch resist undisturbed. In the case of using a laser, mask 410 is not needed.

Figure 5:
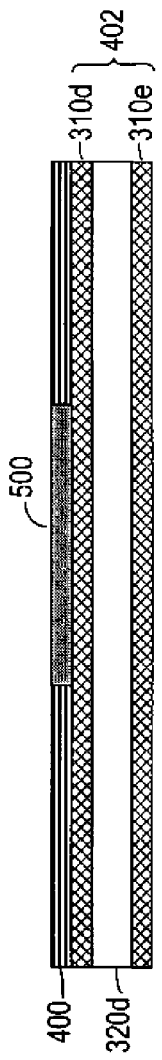
FIG. 5 is an illustration depicting the conducting layers and the dielectric layer of sub-composite structure with an area of altered etch resist, according to certain embodiments of the invention.

FIG. 5 is an illustration depicting the conducting layers 310d, 310e and the dielectric layer 320d of sub-composite structure 402 with an area of altered etch resist 500, according to certain embodiments of the invention. The electromagnetic radiation 420 (FIG. 4) has been terminated and the mask 410 (FIG. 4) has been removed thereby exposing the unaltered etch resist 400.

Figure 6:
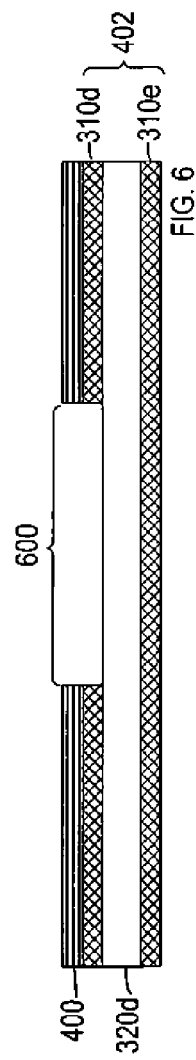
FIG. 6 is an illustration depicting the conducting layers and the dielectric layer of a sub-composite structure with the altered etch resist and a portion of the conducting layer removed to form a clearance in the conductive layer, according to certain embodiments.

FIG. 6 is an illustration depicting the conducting layers 310d, 310e and the dielectric layer 320b of sub-composite structure 402 with the altered etch resist 500 (FIG. 5) and a portion of the conducting layer 310d removed to form a clearance 600 in the conducting layer 310d, according to certain embodiments. The altered etch resist 500 (FIG. 5) has been removed by methods well known in the art thereby exposing a portion of the conducting layer 310d. The exposed portion of the conducting layer 310d is then etched to form the clearance 600 and expose the dielectric layer 320d. Clearance 600 can be in a ground or power plane or in conductive pad or feature on a signal layer.

Figure 7:
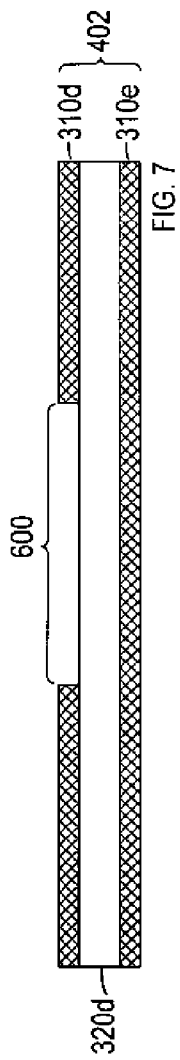
FIG. 7 is an illustration depicting the conducting layers and the dielectric layer of sub-composite structure with the unaltered etch resist removed, according to certain embodiments.

FIG. 7 is an illustration depicting the conducting layers 310d, 310e and the dielectric layer 320d of sub-composite structure 402 with the unaltered etch resist 400 removed, according to certain embodiments. The unaltered etch resist 400 (FIGS. 4-6) may be removed by methods well known in the art, thereby exposing the conducting layer 310d.

Figure 8:
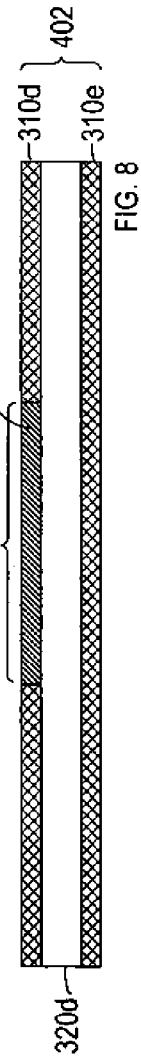
FIG. 8 is an illustration depicting the conducting layers and the dielectric layer of a sub-composite structure with the plating resist deposited within the clearance, according to certain embodiments.

FIG. 8 is an illustration depicting the conducting layers 310d, 310e and the dielectric layer 320d of sub-composite structure 402 with the plating resist 870 deposited within the clearance 600, according to certain embodiments.

For example, a plating resist can be deposited into a clearance using printing, stencil printing, needle dispensing, etc. The plating resist can be a hydrophobic insulating material that is resistant to the deposition of a catalytic species capable of catalyzing an electroless metal deposition. The plating resist can also be a material that resists deposition of other "seed" deposits such as colloidal graphite.

The plating resist can be deposited so as to be flush or higher than the etched clearance layer. The plating resist can be a paste or viscous liquid. Some non-limiting examples of plating resists are silicone resins, polyethylene resins, fluorocarbon resins, polyurethane resins, and acrylic resins. Such insulating hydrophobic resinous material can be used alone or in a combined composition with other resinous materials in amounts sufficient to maintain hydrophobic properties in the combined composition.

After depositing the plating resist, the plating resist is cured using appropriate methods. The sub-composite structure 402 with plating resist 870 in place can now be laminated to the rest of the multilayer PCB stackup using techniques well known in the art. Multiple sub-composite structures (cores) with selectively deposited plating resist areas in varying locations can be laminated to form a PCB stackup. Through-holes are drilled through the PCB stackup through conductive layers, dielectric layers and through the plating resist.

Thus, the PCB panel has multiple through-holes that can then be plated simultaneously by placing the panel into a seed bath, followed by immersion in an electroless copper bath. A non-limiting example of a seed bath is copper palladium colloid. An example for surface plating can be found in U.S. Pat. No. 4,668,532. The electroless copper provides the initial conductivity path to allow for additional electrolytic copper plating of the barrel of each through-hole in the panel. The seed chemistry (electroless copper) will deposit on the surface of the through-hole wall, but will not deposit effectively on areas of the wall with the plating resist. A small amount of electroless copper may deposit on the plating resist but such an amount can be removed with a post processing step known in the art. For example, any small amounts of electroless copper that may be deposited on the plating resist can be removed by contacting the affected areas with a chelating agent in an alkaline solution for a time period sufficient to remove essentially all of said catalytic species from the hydrophobic plating resist. The panel will then follow known processes either for panel plating or pattern plating. For example, electrolytic or electroless plating can be used. In other words, the interior walls of the through-holes are contacted with a metal deposition solution to metallize only the exposed catalytic areas of the walls not protected by the hydrophobic plating resist.

Plating of conductive material in the via structure will build wherever there is seed material. Similarly, no plating of conductive material will form where there is plating resist. Thus, the areas that are void of plated conductive material in the via structure effectively partition the via into electrically isolated sections. By strategically placing plating resist in certain locations and on certain layers of a PCB stackup, multiple electrically isolated portions in via structures can be formed, simultaneously.

Thus, the above method can be used to configure the via structure into multiple electrically isolated segments. Each such segment provides interconnect paths to appropriate layers within the PCB. Such partitioned vias can be subsequently filled with an insulating material like epoxy or other insulating or resistive polymer for improved reliability or increased functionality. Therefore, costly, error prone, and time intensive backdrilling may be avoided. Similarly, referring back to FIG. 3. the use of the plating resist 370 avoids possible damage to the PCB 300 which may result by backdrilling. A further advantage is that, whereas backdrilling is typically controllable to a depth tolerance of +/−5 mils, a controllable depth tolerance of +/−1 mils or better may be achieved by the systems and methods described herein. As a result, the consistency between the plating resist 370, the dielectric layers 320b, and the conducting layer 310c may be held to a tighter standard deviation as compared to backdrilling.

According to certain embodiments, a thicker resist deposit may be preferred. In such a case, the sub-composite structure or core is mechanically drilled with through-holes corresponding to areas where partitioned via structures are desired in the resulting PCB stackup. The thickness of the sub-composite structure can range from about 1-50 mils. Thus, a thicker deposit of plating resist can be produced. The through-holes are filled with plating resist using specialized hole filling equipment, stenciling or screen printing. Such a process is known as hole-plugging or via-filling. The plating resist is then cured using an appropriate process. A planarizing or scrubbing operation may be employed to remove any excess plating resist from the surface of the sub-composite structure. The sub-composite structure can be processed using standard PCB procedures to form circuit images. It is to be noted that the through-holes can be filled with plating resist before or after forming circuit images. The sub-composite structure can then be laminated into a multilayer PCB stackup and the process can continue as described above for electroless seeding and subsequent plating of the interior walls of the one or more via structures in the PCB stackup. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection. The term "transient" as used herein encompasses not only electrostatic discharge events but any phenomena, of short duration, that directly or indirectly induces voltages and currents into a printed circuit board and where the amplitudes of such voltages and currents are high enough to cause degradation or failure of the electronic components on the printed circuit board.

Figure 9:
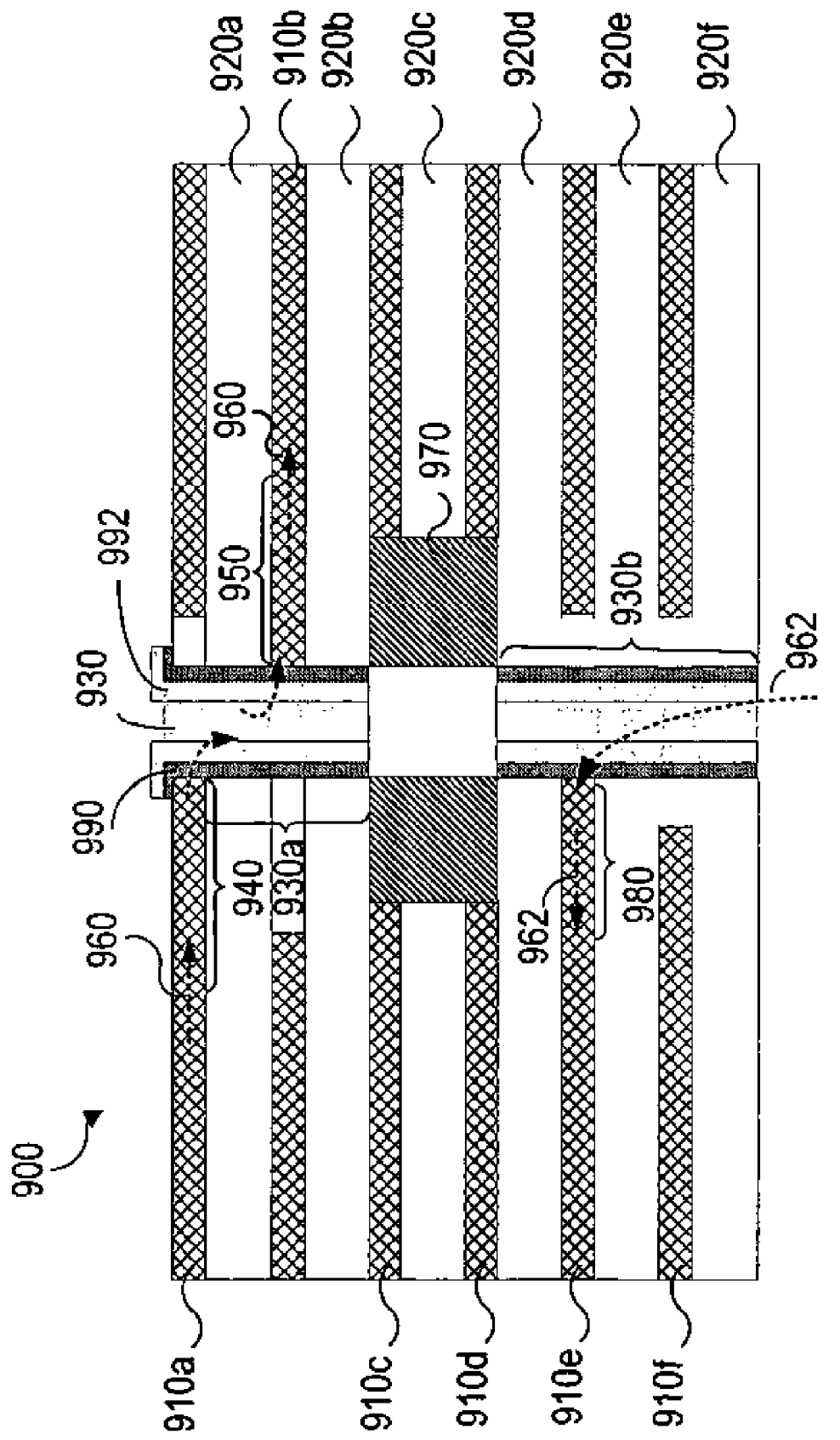
FIG. 9 is an illustration depicting a PCB stackup with a partitioned plated via structure formed using a thicker layer of plating resist, according to certain embodiments.

FIG. 9 is an illustration depicting a PCB stackup with a partitioned plated via structure formed using a thicker layer of plating resist, according to certain embodiments. FIG. 9 shows a PCB 900 that includes conducting layers 910a-910f separated by dielectric layers 920a-920f. The plated via structure 930 is plated with a seed conductive material 990 and a further coating of conductive material 992. The plated via 930 is effectively partitioned into a plurality of electrically isolated portions (930a, and 930b) by selectively depositing plating resist in a sub-composite structure used for making the PCB stackup.

FIG. 9 shows that the partitioned plated via allows an electrical signal 960 to transmit from one trace 940 on a first conducting layer 910a to another trace 950 on a second conducting layer 910b of the PCB 900 by traversing the isolated portion 930a of the via 930 without signal integrity being degraded through interference caused by portion 930b. The conductive material 992 of the plated via structure 930 is the medium through which the electrical signal 960 travels from the first conducting layer 910a of the PCB 900 to the second conducting layer 910b. Similarly, the isolated portion 930b of the via 930 allows another electrical signal 962 to transmit to trace 980 without interfering with the signal 960. The plating resist 970 prevents the deposition of the conductive material 990 and 992 within the via structure 930 at the conducting layers 910c and 910d. As a result, via 930 is effectively partitioned into the electrically isolated portions 930a, and 930b.

The PCB 900 can have any number of conducting layers and dielectric layers. FIG. 9 only shows six layers of conducting layers 910a-910f and six layers of dielectric layers 920a-920f for the sake of simplicity. Each of the conducting layers 910a-910f may comprise a partial or full layer such as a power or ground layer, and may comprise a layer of circuit traces, or may comprise a layer with both circuit traces and a partial layer such as a ground layer. A non-limiting example of the conducting layers 910a-910f is copper and some non-limiting examples of dielectric layers 920a-920f are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited in a clearance formed in a conducting layer and an adjacent dielectric layer of a sub-composite structure. In such a case, the sub-composite structure can be mechanically or laser drilled to form a blind hole. The blind hole starts at one conductive layer of the sub-composite structure, proceeds through the dielectric layer and terminates on another conductive layer of the sub-composite structure. However, the depth of the blind hole can be drilled to any depth short of reaching the conductive layer of the sub-composite structure. Plating resist is then deposited into the blind hole using a squeegeeing, stenciling, or screen printing operation, for example. The resist is then cured. A planarizing or scrubbing operation may be employed to remove resist from the open end of the blind hole. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. The advantage in such a via structure is that the plating resist does not come out of the blind end of the hole and a connection can be made to the undrilled conductive layer of the sub-composite structure (core). According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 10:
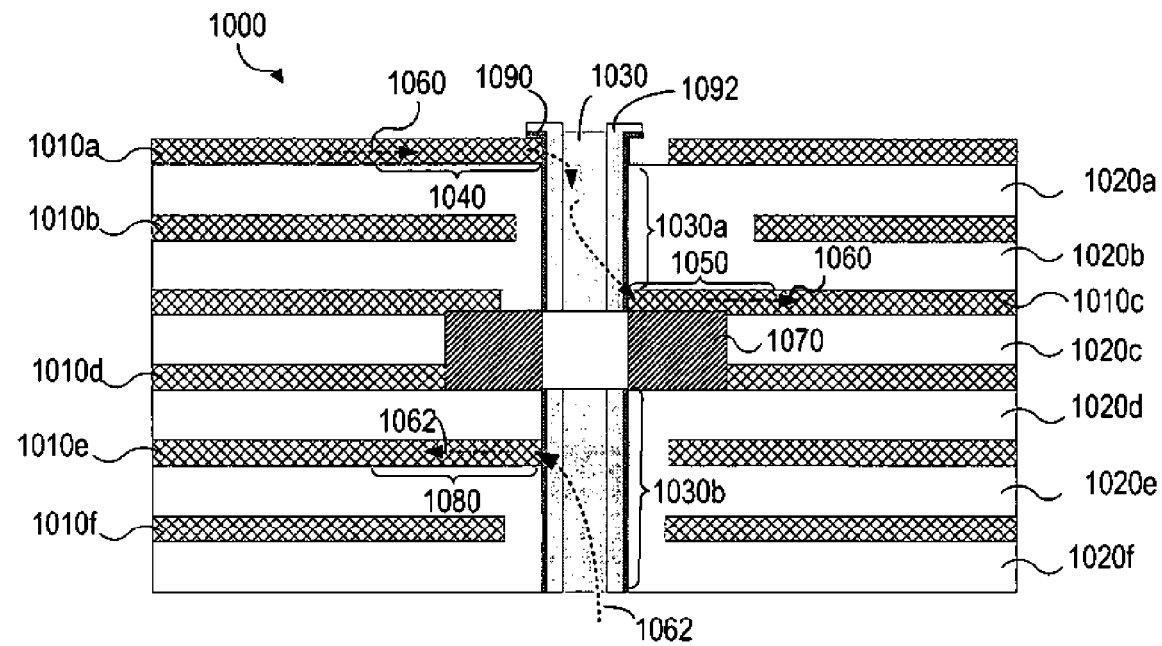
FIG. 10 is an illustration depicting a PCB stackup with a partitioned plated via structure formed by selectively depositing plating resist in a clearance formed in a conducting layer and an adjacent dielectric layer of a sub-composite structure, according to certain embodiments.

FIG. 10 is an illustration depicting a PCB stackup with a partitioned plated via structure formed by selectively depositing plating resist in a clearance formed in a conducting layer and an adjacent dielectric layer of a sub-composite structure, according to certain embodiments. FIG. 10 shows a PCB 1000 that includes conducting layers 1010a-1010f separated by dielectric layers 1020a-1020f. The plated via structure 1030 is plated with a seed conductive material 1090 and a further coating of conductive material 1092. The plated via 1030 is effectively partitioned into a plurality of electrically isolated portions (1030a, and 1030b) by selectively depositing plating resist in a sub-composite structure used for making the PCB stackup.

FIG. 10 shows that the partitioned plated via allows an electrical signal 1060 to transmit from one trace 1040 on a first conducting layer 1010a to another trace 1050 on a different conducting layer 1010c of the PCB 1000 by traversing the isolated portion 1030a of the via 1030 without signal integrity being degraded through interference caused by portion 1030b. The conductive material 1092 of the plated via structure 1030 is the medium through which the electrical signal 1060 travels from the first conducting layer 1010a of the PCB 1000 to the another conducting layer 1010c. Similarly, the isolated portion 1030b of the via 1030 allows another electrical signal 1062 to transmit to trace 1080 without interfering with the signal 1060. The plating resist 1070 prevents the deposition of the conductive material 1090 and 1092 within the via structure 1030 at the conducting layer 1010d and the dielectric layer 1020c. As a result, via 1030 is effectively partitioned into the electrically isolated portions 1030a, and 1030b.

The PCB 1000 can have any number of conducting layers and dielectric layers. FIG. 10 only shows six layers of conducting layers 1010a-1010f and six layers of dielectric layers 1020a-1020f for the sake of simplicity. Each of the conducting layers 1010a-1010f may comprise a partial or full layer such as a power or ground layer, and may comprise a layer of circuit traces, or may comprise a layer with both circuit traces and a partial layer such as a ground layer. A non-limiting example of the conducting layers 1010a-1010f is copper and some non-limiting examples of dielectric layers 1020a-1020f are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited on the surface of a sub-composite structure on the exposed dielectric on the surface that is coplanar with the top conducting layer of the sub-composite structure. In such a case, the plating resist is deposited onto an etched surface of a sub-composite core on the exposed dielectric. The plating resist is deposited onto the dielectric using screen printing, stenciling, needle depositing or other methods know in the art. The thickness of the deposit of plating resist can be adjusted to a range up to 5 mils thick. The deposit of plating resist can be any shape but typically would be round or square in geometry. After deposition, the resist is cured using appropriate process. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 11:
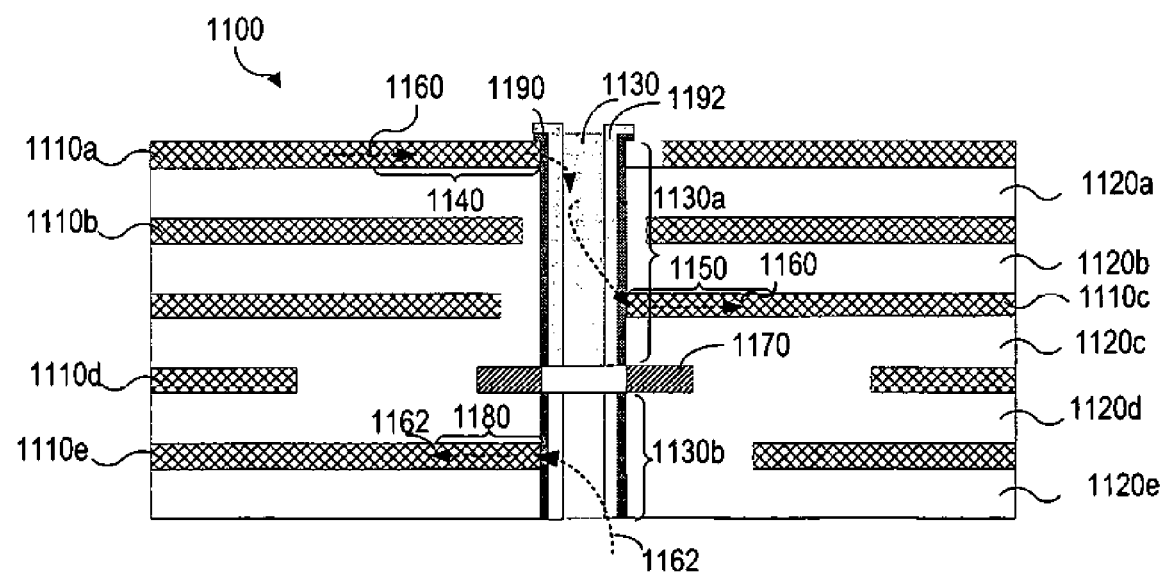
FIG. 11 is an illustration depicting a PCB stackup with a partitioned plated via structure formed by selectively depositing plating resist on the surface of a sub-composite structure on an anti-pad region of the surface that is coplanar with the top conducting layer of the sub-composite structure, according to certain embodiments.

FIG. 11 is an illustration depicting a PCB stackup with a partitioned plated via structure formed by selectively depositing plating resist on the surface of a sub-composite structure on the exposed dielectric, according to certain embodiments. FIG. 11 shows a PCB 1100 that includes conducting layers 1110a-1110e separated by dielectric layers 1120a-1120e. The plated via structure 1130 is plated with a seed conductive material 1190 and a further coating of conductive material 1192. The plated via 1130 is effectively partitioned into a plurality of electrically isolated portions (1130a, and 1130b) by selectively depositing plating resist in a sub-composite structure used for making the PCB stackup.

FIG. 11 shows that the partitioned plated via allows an electrical signal 1160 to transmit from one trace 1140 on a first conducting layer 1110a to another trace 1150 on a different conducting layer 1110c of the PCB 1100 by traversing the isolated portion 1130a of the via 1130 without signal integrity being degraded through interference caused by portion 1130b. The conductive material 1192 of the plated via structure 1130 is the medium through which the electrical signal 1160 travels from the first conducting layer 1110a of the PCB 1100 to the another conducting layer 1110c. Similarly, the isolated portion 1130b of the via 1130 allows another electrical signal 1162 to transmit to trace 1180 without interfering with the signal 1160. The plating resist 1170 prevents the deposition of the conductive material 1190 and 1192 within the via structure 1130 at an area between the conducting layer 1110c and another conductive layer 1110e. As a result, via 1130 is effectively partitioned into the electrically isolated portions 1130a, and 1130b. The plated via structure 1130 may be of any shape.

The PCB 1100 can have any number of conducting layers and dielectric layers. FIG. 11 only shows five layers of conducting layers 1110a-1110e and five layers of dielectric layers 1120a-1120e for the sake of simplicity. Each of the conducting layers 1110a-1110e may comprise a partial or full layer such as a power or ground layer, and may comprise a layer of circuit traces, or may comprise a layer with both circuit traces and a partial layer such as a ground layer. A non-limiting example of the conducting layers 1110a-1110e is copper and some non-limiting examples of dielectric layers 1120a-1120e are epoxy glass, polyimide glass, ceramic hydrocarbon, polyimide film, Teflon film, resin impregnated matte material, Kevlar, paper, resin dielectrics with dispersed nano-powders.

According to certain embodiments, plating resist is selectively deposited on the surface of a sub-composite structure on a conductive region or conductive pad on the surface of the sub-composite structure. The conductive region could be patterned to be a plane or could be an individual pad or feature. In the case of a pad or feature, the plating resist may overlap the pad. The plating resist is deposited onto the conductive region using screen printing, stenciling, needle depositing or other methods know in the art. The deposit of plating resist can be any shape but typically would be round or square in geometry. After deposition, the resist is cured using appropriate process. The sub-composite structure can be processed using standard PCB procedures to form circuit images. It is to be noted that the plating resist can be deposited before or after forming circuit images. The sub-composite structure can then be laminated into a multilayer PCB stackup and the process can continue as described above for electroless seeding and subsequent plating of the interior walls of the via structure. According to certain embodiments, the partitioned via is filled with an electrically insulating material, ohmically resistive paste or voltage switchable dielectric material to improve reliability or functionality. In the case of using voltage switchable dielectric material, programmable circuit routing in PCBs can be made. Further, the voltage switchable dielectric material can provide transient protection.

Figure 12:
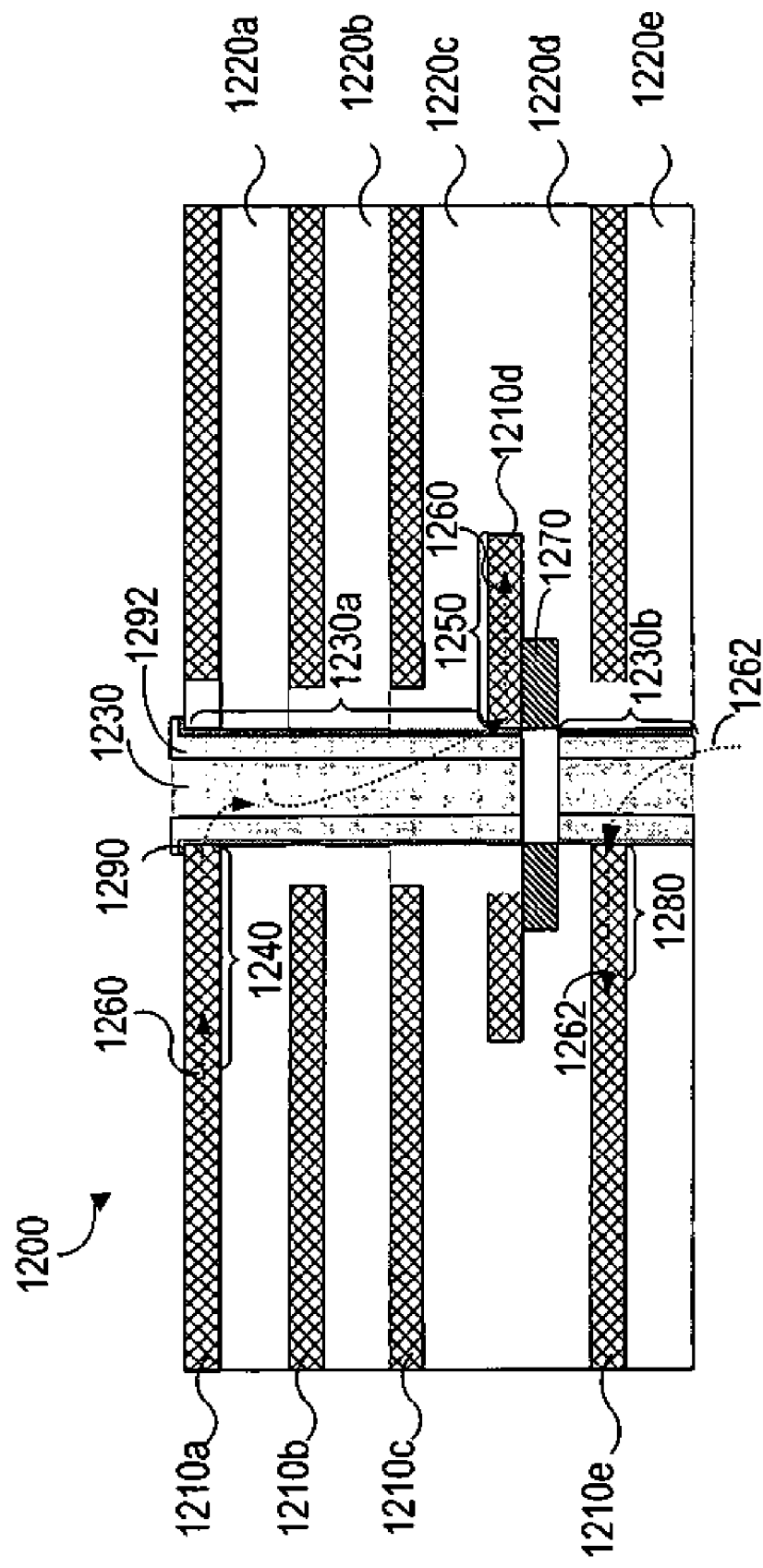
FIG. 12 is an illustration depicting a PCB stackup with a partitioned plated via structure formed by selectively depositing plating resist on a conductive region or conductive pad on the surface of the sub-composite structure, according to certain embodiments.

FIG. 12 is an illustration depicting a PCB stackup with a partitioned plated via structure formed by selectively depositing plating resist on a conductive region or conductive pad on the surface of the sub-composite structure, according to certain embodiments. FIG. 12 shows a PCB 1200 that includes conducting layers 1210a-1210e separated by dielectric layers 1220a-1220e. The plated via structure 1230 is plated with a seed conductive material 1290 and a further coating of conductive material 1292. The plated via 1230 is effectively partitioned into a plurality of electrically isolated portions (1230a, and 1230b) by selectively depositing plating resist in a sub-composite structure used for making the PCB stackup.

FIG. 12 shows that the partitioned plated via allows an electrical signal 1260 to transmit from one trace 1240 on a first conducting layer 1210a to another trace 1250 on the conducting pad 1210d of the PCB 1200 by traversing the isolated portion 1230a of the via 1230 without signal integrity being degraded through interference caused by portion 1230b. The conductive material 1292 of the plated via structure 1230 is the medium through which the electrical signal 1260 travels from the first conducting layer 1210a of the PCB 1200 to the conducting pad 1210d. Similarly, the isolated portion 1230b of the via 1230 allows another electrical signal 1262 to transmit to trace 1280 without interfering with the signal 1260. The plating resist 1270 prevents the deposition of the conductive material 1290 and 1292 within the via structure 1230 at an area between the conducting layer 1210e and the conducting pad 1210d. As a result, via 1230 is effectively partitioned into the electrically isolated portions 1230a, and 1230b. The plated via structure 1230 may be of any shape.

The PCB 1200 can have any number of conducting layers and dielectric layers. FIG. 12 only shows five layers of conducting layers 1210a-1210e and five layers of dielectric layers 1120a-1120e for the sake of simplicity. Each of the conducting layers 1210a-1210e may comprise a partial or full layer such as a power or ground layer, and may comprise a layer of circuit traces, or may comprise a layer with both circuit traces and a partial layer such as a ground layer. A non-limiting example of the conducting layers 1210a-1210f is copper and some non-limiting examples of dielectric layers 1220a-1220e are epoxy glass, polyimide glass, ceramic hydrocarbon, polyimide film, Teflon film, resin impregnated matte material, Kevlar, paper, resin dielectrics with dispersed nano-powders.

Due to the selective nature of the plating resist deposition and simultaneous plating of the vias resulting in partitioned sections, vias can be subdivided into multiple sections each capable of carrying signals without disturbing signals in other sections. To do so effectively, a computer program is advantageous to use when designing a PCB layout. For example, the computer program would be patched to an ECAD software such as Cadence Allegro™ or Mentor Expedition™ or Supermax™. The computer program can also run as a stand alone software module, which would import data from an ECAD system, partition the vias, then output appropriate files back to the ECAD or Computer Aided Manufacturing (CAM) system. Such software can also output files to be used for programming manufacturing equipment to drill appropriate holes in selected cores and/or generate art work to manufacture stencils for selective deposition of the plating resist. Thus, by determining the locations of the plating resist and location of the resulting partitioned vias, a PCB design can be optimized to increase routing density and improve integrity. In the case of a pre-existing design of a PCB layout, the computer program can be used to identify locations for selective depositions of plating resist in locations that correlate to locations for backdrilling, for example.

In the foregoing specification, embodiments of the invention have been described with reference to numerous specific details that may vary from implementation to implementation. The specification and drawings are, accordingly, to be regarded in an illustrative rather than a restrictive sense. The invention is intended to be as broad as the appended claims, including all equivalents thereto.

We claim:

1. A multilayer printed circuit board, comprising:
   at least one sub-composite structure having a plurality of layers including a dielectric layer arranged between a first conductive layer and a second conductive layer;
   at least one clearance located in the plurality layers of the at least one sub-composite structure;
   a plating resist selectively deposited in the at least one clearance;
   a through-hole formed through the plurality of the at least one sub-composite structure and passing through the plating resist, an interior surface of the through-hole plated with a conductive material in areas of the interior surface that are devoid of the plating resist to form a partitioned via structure extending through two or more conductive layers in the plurality of layers of the at least one sub-composite structure, the partitioned via structure having a first segment electrically isolated from a second segment; and a voltage switchable dielectric material at least partially filling the partitioned via structure and extending from the first segment to the second segment.

2. The printed circuit board of claim 1, wherein the first segment is coupled to the first conductive layer in the at least one sub-composite structure and wherein the second segment is coupled to the second conductive layer in the at least one sub-composite structure.

3. The printed circuit board of claim 1, wherein the voltage switchable dielectric material provides programmable circuit routing and a signal path from the first segment to the second segment in the multilayer printed circuit board.

4. The printed circuit board of claim 1, wherein the first segment is coupled to a first signal trace and the second segment is coupled to a second signal trace and wherein the first segment is selectively and electrically coupled to the second segment through the voltage switchable dielectric material.

5. The printed circuit board of claim 1, wherein the voltage switchable dielectric material provides transient signal protection to electrical components coupled to the first conductive layer or the second conductive layer.

6. The printed circuit board of claim 1, wherein the first conductive layer is a power plane and the second conductive layer is a ground plane.

7. The printed circuit board of claim 1, wherein the at least one sub-composite structure includes at least one power plane and at least one a ground plane.

8. The printed circuit board of claim 1, wherein the first segment and second segment are separated along a diameter of the partitioned via structure.

9. The printed circuit board of claim 1, further comprising: a catalyzing material arranged between the interior surface of the through-hole and the conductive material.

10. The printed circuit board of claim 1, wherein the at least one clearance has a radius greater than a radius of the partitioned via structure.

11. The printed circuit board of claim 1, wherein the at least one clearance includes a top surface and a bottom surface and wherein the plating resist deposited in the at least one clearance is substantially level with the top surface of the at least one clearance.

12. The printed circuit board of claim 1, wherein the at least one clearance includes a top surface and a bottom surface and wherein the plating resist extends beyond the top surface of the at least one clearance into at least one layer of the at least one sub-composite structure located above the top surface of the at least one clearance.

13. The printed circuit board of claim 1, wherein the plating resist comprises an insulating hydrophobic resinous material resistant to a deposition of a catalytic species capable of catalyzing an electroless metal deposition.

14. The printed circuit board of claim 1, wherein the plating resist is one of a dry film, a paste and a viscous liquid.

15. A sub-composite structure for use with a multilayer printed circuit board, comprising:
one or more layers including a dielectric layer arranged between a first conductive layer and a second conductive layer;
at least one clearance located in the one or more layers;
a plating resist selectively deposited in the at least one clearance;
a through-hole formed through the one or more layers and passing through the plating resist, an interior surface of the through-hole plated with a conductive material in areas of the interior surface that are devoid of the plating resist to form a partitioned via structure through the one or more layers, the partitioned via structure having a first segment electrically isolated from a second segment; and
a voltage switchable dielectric material at least partially filling the partitioned via structure and extending from the first segment to the second segment.

16. The printed circuit board of claim 15, wherein the voltage switchable dielectric material forms a programmable circuit route and a signal path from the first segment to the second segment.

17. The printed circuit board of claim 15, wherein the material is an ohmically resistive paste so that an integrated resistor is formed along the partitioned via structure.

18. The printed circuit board of claim 15, wherein the first segment is coupled to the first conductive layer and wherein the second segment is coupled to the second conductive layer.

19. The printed circuit board of claim 15, wherein the first conductive layer is a power plane and the second conductive layer is a ground plane.

20. The printed circuit board of claim 15, further comprising: a catalyzing material arranged between the interior surface of the through-hole and the conductive material.

21. A multilayer printed circuit board, comprising:
at least one sub-composite structure having one or more layers including a dielectric layer arranged between a first conductive layer and a second conductive layer, where the first conductive layer is a power plane and the second conductive layer is a ground plane;
at least one clearance located in the one or more layers of the at least one sub-composite structure;
a plating resist selectively deposited in the at least one clearance;
a through-hole formed through the one or more layers of the at least one sub-composite structure and passing through the plating resist, an interior surface of the through-hole plated with a catalyzing material and further coated with a conductive material in areas of the interior surface that are devoid of the plating resist to form a partitioned via structure through the one or more layers of the at least one sub-composite structure, the partitioned via structure having a first segment electrically isolated from a second segment; and
a voltage switchable dielectric material at least partially filling the partitioned via structure and extending from the first segment to the second segment, where the first segment is coupled to a first signal trace and the second segment is coupled to a second signal trace and where the first segment is programmed to the second segment through the voltage switchable dielectric material;
wherein the voltage switchable dielectric material provides transient signal protection to electrical components connected to the first conductive layer or the second conductive layer and a programmable circuit routing and a signal path from the first segment to the second segment; and
wherein the at least one clearance has a radius greater than a radius of the partitioned via structure.

* * * * *